US010447178B1

(12) United States Patent
Hays et al.

(10) Patent No.: US 10,447,178 B1
(45) Date of Patent: Oct. 15, 2019

(54) SYSTEMS, ARTICLES OF MANUFACTURE, APPARATUS AND METHODS EMPLOYING PIEZOELECTRICS FOR ENERGY HARVESTING

(71) Applicants: Tosha Hays, Atlanta, GA (US); Mary-Cathryn Kolb, Atlanta, GA (US)

(72) Inventors: Tosha Hays, Atlanta, GA (US); Mary-Cathryn Kolb, Atlanta, GA (US)

(73) Assignee: BRRR! Inc., Atlanta, GA (US)

( * ) Notice: Subject to any disclaimer, the term of this patent is extended or adjusted under 35 U.S.C. 154(b) by 479 days.

(21) Appl. No.: 15/423,064

(22) Filed: Feb. 2, 2017

Related U.S. Application Data

(60) Provisional application No. 62/290,322, filed on Feb. 2, 2016.

(51) Int. Cl.
*H01L 41/09* (2006.01)
*H02N 2/18* (2006.01)
(Continued)

(52) U.S. Cl.
CPC ............ *H02N 2/181* (2013.01); *A41D 1/002* (2013.01); *A43B 3/0015* (2013.01); *A45C 3/06* (2013.01); *A45C 15/00* (2013.01); *H01L 41/113* (2013.01)

(58) Field of Classification Search
CPC ...... H02N 2/181; A41D 1/002; A43B 3/0015; A45C 3/06; A45C 15/00
(Continued)

(56) References Cited

U.S. PATENT DOCUMENTS 4,782,602 A 11/1988 Lakic
4,948,951 A 4/1990 Balzano
(Continued)

FOREIGN PATENT DOCUMENTS

CA 2615287 A1 2/2007
CN 201557572 U 8/2010
(Continued)

OTHER PUBLICATIONS

Erwin, et al., "Personal Energy Harvester," Feb. 22, 2005, 9 pages. Last accessed: Oct. 2015. http://www54.homepage.villanova.edu/michael.erwin/Docs/BSOTA(final).doc.
(Continued)

*Primary Examiner* — Thomas M Dougherty
(74) *Attorney, Agent, or Firm* — Thomas|Horstemeyer, LLP

(57) ABSTRACT

The subject disclosure can facilitate piezoelectrics for energy harvesting. In one example, an article of manufacture (AOM) is provided. The AOM can comprise a piezoelectric fabric comprising: a piezoelectric film; an elastic base on which the piezoelectric film is bonded forming a piezoelectric material; and a yarn, wherein the yarn and the piezoelectric material are coupled to one another in a defined ratio of interlacement. The yarn and the piezoelectric material are configured as coils in some embodiments. In some embodiments, the piezoelectric material is configured such that compression or elongation of the piezoelectric material generates electrical energy. In some embodiments, the AOM further comprises a power management module coupled to the piezoelectric material and configured to store electrical energy received from the piezoelectric material. The AOM can also comprise a rivet, grommet or button coupled to the piezoelectric material or the power management module and configured to capture energy.

20 Claims, 14 Drawing Sheets

(51) Int. Cl.
*A43B 3/00* (2006.01)
*H01L 41/113* (2006.01)
*A41D 1/00* (2018.01)
*A45C 15/00* (2006.01)
*A45C 3/06* (2006.01)

(58) Field of Classification Search
USPC .............. 319/311, 318, 319, 328, 339, 800
See application file for complete search history.

(56) References Cited

U.S. PATENT DOCUMENTS

| | | | |
|---|---|---|---|
| 5,500,635 A | 3/1996 | Mott | |
| 5,565,124 A | 10/1996 | Balzano | |
| 6,198,204 B1 | 3/2001 | Pottenger | |
| 6,281,594 B1 | 8/2001 | Sarich | |
| D489,164 S | 5/2004 | Isom | |
| 7,233,829 B2 | 6/2007 | Vlad | |
| 7,304,416 B2 | 12/2007 | Mullen | |
| D571,080 S | 6/2008 | Slimane | |
| 7,491,185 B2 | 2/2009 | Couvillon, Jr. | |
| 7,845,022 B1 | 12/2010 | Surve | |
| 7,859,171 B2 | 12/2010 | Micallef | |
| 7,982,370 B2 | 7/2011 | Wang et al. | |
| 8,564,178 B2 | 10/2013 | Hsu et al. | |
| 8,569,935 B1 | 10/2013 | Kosierkiewicz | |
| D705,519 S | 5/2014 | Meyer | |
| D712,627 S | 9/2014 | Shonafelt | |
| D736,495 S | 4/2015 | Bednarz | |
| 2006/0280948 A1* | 12/2006 | Moreshead | B32B 5/024 428/411.1 |
| 2011/0128686 A1* | 6/2011 | Moreshead | D03D 1/0076 361/679.01 |
| 2011/0128726 A1* | 6/2011 | Moreshead | D03D 1/0076 362/183 |
| 2011/0130813 A1* | 6/2011 | Moreshead | A61F 13/00051 607/112 |
| 2013/0106245 A1 | 5/2013 | Giebe et al. | |
| 2014/0111063 A1 | 4/2014 | Bae et al. | |
| 2014/0126186 A1* | 5/2014 | Tseng | H01L 41/04 362/103 |
| 2014/0170919 A1 | 6/2014 | Manipatruni et al. | |
| 2014/0217853 A1 | 8/2014 | Mankowski | |
| 2015/0280102 A1 | 10/2015 | Tajitsu et al. | |
| 2017/0163178 A1* | 6/2017 | Dabby | F03G 5/08 |
| 2017/0246073 A1* | 8/2017 | Van-De-Velde | A61F 13/00051 |
| 2018/0151795 A1* | 5/2018 | Cobanoglu | H01L 41/087 |
| 2018/0171514 A1* | 6/2018 | Cobanoglu | G01K 7/003 |

FOREIGN PATENT DOCUMENTS

| | | | | |
|---|---|---|---|---|
| DE | 29622369 U1 | 4/1997 | | |
| KR | 101040525 B1 | 6/2011 | | |
| WO | WO-2017111108 | * | 6/2017 | .......... H01L 41/087 |

OTHER PUBLICATIONS

Li, et al., "Cloth-Based Power Shirt for Wearable Energy Harvesting and Clothes Ornamentation," ACS Applied Materials & Interfaces, Jun. 22, 2015, vol. 7, Issue No. 27, pp. 14912-14916, American Chemical Society. http://pubs.acs.org/doi/abs/10.1021/acsami.5b03680.

Sheikh, "Modeling of Power Consumption and Fault Tolerance for Electronic Textiles," Sep. 19, 2003, 62 pages. https://vtechworks.lib.vt.edu/bitstream/handle/10919/9605/tsheikh_2003_thesis.pdf?sequence=1.

Lunsford, et al., "A Small Future: Nanotechnology in Fabrics," Twelfth Annual Freshman Conference, Feb. 10, 2012, 7 pages. Last accessed: Oct. 2015. http://136.142.82.187/eng12/Author/data/2356.docx.

Toon, "Fiber-Based Nanotechnology in Clothing Could Harvest Energy from Physical Movement." EurekAlert! Science News, Feb. 13, 2008, 6 pages. Last accessed: Oct. 2015. http://www.eurekalert.org/pub_releases/2008-02/giot-fni020908.php.

* cited by examiner

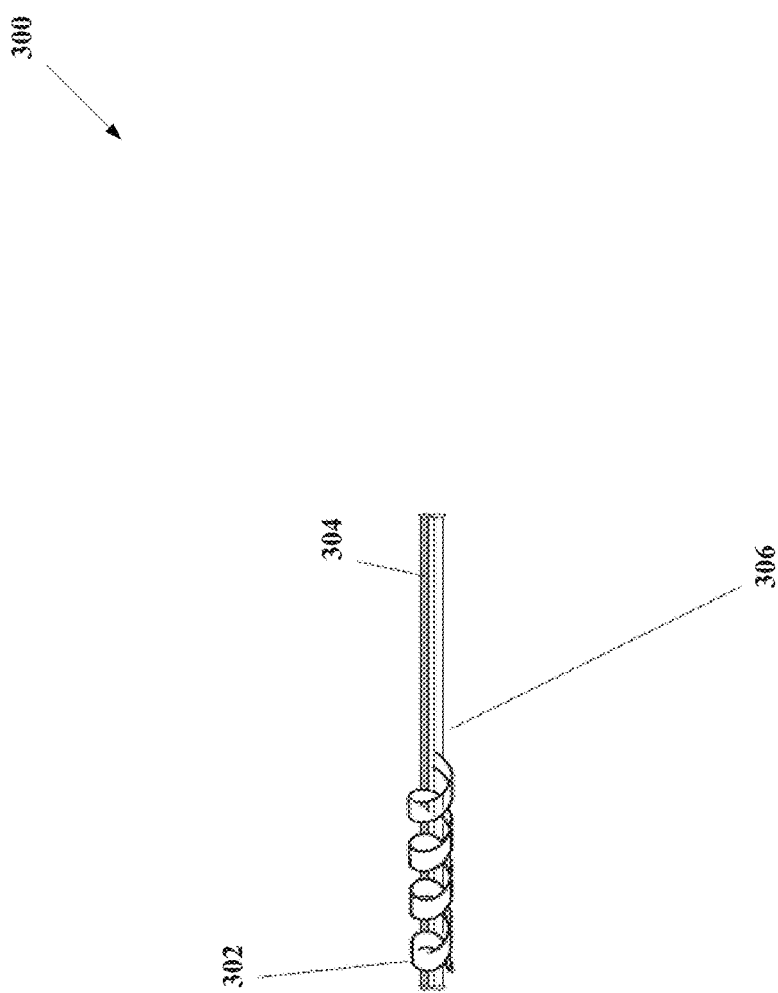

SYSTEMS, ARTICLES OF MANUFACTURE, APPARATUS AND METHODS EMPLOYING PIEZOELECTRICS FOR ENERGY HARVESTING

CROSS-REFERENCE TO RELATED APPLICATIONS

This application claims priority to and the benefit of U.S. provisional patent application No. 62/290,322, filed Feb. 2, 2016, and titled "SYSTEMS, ARTICLES OF MANUFACTURE, APPARATUS AND METHODS FACILITATING PIEZOELECTRICS FOR ENERGY HARVESTING," the entirety of which is incorporated by reference herein.

TECHNICAL FIELD

The subject disclosure relates generally to energy harvesting, and specifically to systems, articles of manufacture, apparatus and methods employing piezoelectrics for energy harvesting.

BRIEF DESCRIPTION OF THE DRAWINGS

FIG. 3 illustrates a schematic diagram of another example of a piezoelectric fabric in accordance with one or more embodiments described herein.

DETAILED DESCRIPTION

Figure 1:
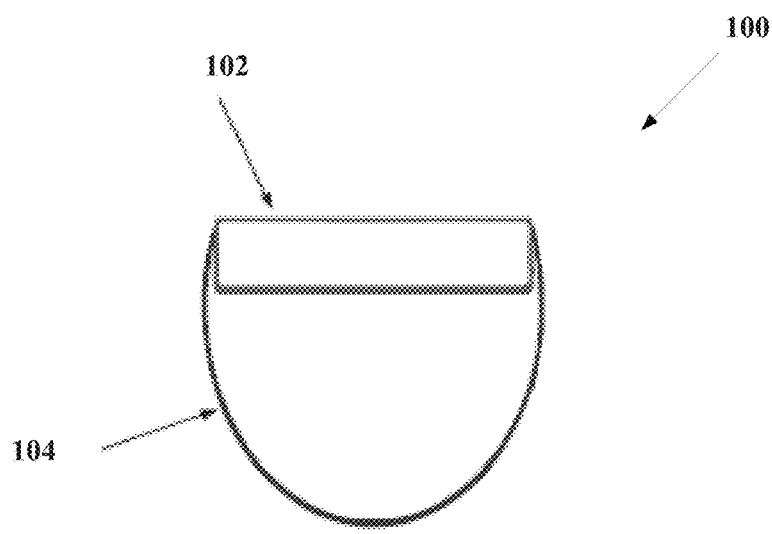
FIG. 1 illustrates a schematic diagram of an example of a side cross-sectional view of piezoelectric material that facilitates energy harvesting in accordance with one or more embodiments described herein.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

While various components are illustrated as separate components, it will be appreciated that multiple components can be implemented as a single component, or a single component can be implemented as multiple components, without departing from the spirit and scope of the example embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. Further, measurements shown in the drawings herein are mere examples for illustration purposes, and the embodiments described are not limited to such measurements.

As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Solar energy harvesting is a conventional approach to energy harvesting. In some cases, solar energy harvesting can employ Dye Synthesized Solar Cells (DSSC) as the primary collector of energy. However, solar energy harvesting is limited by the availability of light sources and has generally low power output from the DSSCs. Another limitation of solar energy harvesting is the lack of physical flexibility of the DSSCs. Even the most flexible DSSCs available are not likely to have suitable physical flexibility for incorporation in apparel. Although the term "apparel" is used herein, it is to be understood that apparel can extend to or include, and is not limited to, shoes and handbags (as well as clothing, hats, sunglasses and the like).

Thermal energy can be employed to provide harvesting of thermal energy from body heat. In some embodiments described herein, thermal energy can be employed to perform energy harvesting using apparel by inserting thermoelectric generators (TEGs) into garments at points where the radiant heat from the body is warmest. TEGs can convert heat into electricity when there is a temperature difference between sides of the TEG. This phenomenon is known as the Seebeck effect. The Seebeck effect is a phenomenon in which a temperature difference between two dissimilar electrical conductors or semiconductors produces a voltage difference between the two substances. In a garment, the TEG is sewn into the fabric with one side of the TEG close to the warm body and the other side facing away from the body, being cooled by the air. The temperature difference causes electrical current to flow through the TEG. However, unfortunately, thermal harvesting with TEGs can be limited by low voltage output, and TEGs can become non-operational when no temperature gradient exists between the two conductors (or the two semiconductors of the TEGs).

In various embodiments, examples of low voltage levels (supply system) can be 50-1000 root mean square voltage ($V_{rms}$) (alternating current (AC)) or 120-1500 volts (V) (direct current (DC)). In some embodiments, a low (distribution system) voltage can be any voltage between approximately 0-49 V. The low distribution system voltage can be voltage (1 to 20 volts) between 250.20 amperes (A) in some embodiments.

While values are provided, these are merely shown as examples. In other embodiments, any number of values known to those skilled in the art as low voltage values can be employed, and all such variations and embodiments are intended to be envisaged and encompassed herein.

The limitations of solar and thermal harvesting greatly restrict their use in apparel. Additionally, the physical size and appearance of DSSCs and TEGs can detract from the aesthetic of the clothing.

Comparably, one or more embodiments of piezoelectric energy harvesting described in greater detail herein can offer higher voltage output and may not suffer from the limitations of solar and/or thermal energy harvesting. A piezoelectric is a substance (e.g., embodied as a film or otherwise) that can generate an electric charge in response to applied mechanical stress on the material. Examples of piezoelectrics include, but are not limited to, barium titanate and lead zirconate titanate. Some forms of piezoelectric-based energy generation can be integrated directly into the yarn of fabric without altering the aesthetic value of the garment in one or more embodiments of the invention described herein.

One or more embodiments described herein can include systems, apparatus, articles of manufacture and/or methods that facilitate energy harvesting employing piezoelectrics. Energy harvesting devices are likely to be the power source of choice for wearable technology in the future. As used herein, one or more embodiments of energy harvesting can include, but is not limited to, the process of gathering, processing and/or storing ambient energy such as optical, thermal, or kinetic energy, converting the ambient energy to electrical energy and/or storing the electrical energy for use by electronic devices. In some embodiments, the energy harvesting described can be employed to facilitate charging and/or re-charging of electronic devices exterior to (or otherwise coupled to) the piezoelectric fabric or apparel comprised of the piezoelectric fabric (e.g., smart phones or other electrical devices).

As used herein, piezoelectric material can be comprised of piezoelectric substance (e.g., piezoelectric film, piezoelectric elements, piezoelectric compositions, piezoelectric powders or otherwise) that can be coupled to (bonded to) a base (e.g., an elastic base). Further, in various embodiments, while a piezoelectric film is described, in other embodiments, other forms of piezoelectrics are also envisaged including, but not limited to, piezoelectric ribbons, piezoelectric materials, piezo ceramics and the like. In one or more embodiments of the invention, the piezoelectric material can be coupled to a yarn to form piezoelectric fabric. As such, as used herein, one or more embodiments that reference the use of "piezoelectric material" can alternatively use "piezoelectric fabric," "piezoelectric substance" or "piezoelectrics" as defined. Accordingly, while one or more embodiments described herein refer to a piezoelectric, it is to be understood that such embodiments can include and/or encompass piezoelectric film, piezoelectric material and/or piezoelectric fabric, as appropriate given the design and description provided. All such embodiments are envisaged.

One or more embodiments described herein encompass apparel that includes or is manufactured incorporating energy harvesting technology. These embodiments, which can include apparel, material, fabric and/or yarn that facilitate energy harvesting can provide a ubiquitous, unobtrusive platform from which to collect ambient energy and/or kinetic energy in various embodiments. By way of example, but not limitation, in various embodiments, ambient energy can be collected from lights, body heat, or through the kinetic energy created by body movement. Kinetic energy can be energy generated based on an action of a user of the apparel, material, fabric and/or yarn that facilitates energy harvesting. In some embodiments, energy (ambient or kinetic) is collected based on creation of energy via compression or decompression of the piezoelectric in the apparel, material, fabric and/or yarn.

FIG. 1 illustrates a schematic diagram of an example of a side cross-sectional view of piezoelectric material 100 that facilitates energy harvesting in accordance with one or more embodiments described herein. The piezoelectric material 100 can comprise piezoelectric film 102 bonded to the elastic base 104. While the embodiment shown indicates piezoelectric film 102 and elastic base 104, in various embodiments, one or more of the piezoelectic film 102 can be in any number of different forms (e.g., ribbon, powders or the like) and/or the elastic base 104 need not be elastic. For example, in some embodiments, the elastic base 104 can be substituted for a base that is non-elastic or substantially non-elastic.

In some embodiments, piezoelectric material 100 or piezoelectric film 102 can transform the kinetic energy created by body motion into electrical energy. For example, in embodiments in which the piezoelectric material 100 or piezoelectric film 102 is incorporated into apparel, a wearer of the apparel (or user of the apparel in embodiments in which the apparel includes handbags or sunglasses, for example) can perform one or more physical movements (e.g., walking, running, bending of a joint, breathing) and/or can generate heat through normal exertion of the body throughout the day. Such exertion or movement can excite the piezoelectric film 102 or the piezoelectric material 100 of the apparel and cause electrical energy to be generated. In some embodiments, the body motion causes force to be applied to the piezoelectric film 102 or piezoelectric material 100 and the piezoelectric film 102 or piezoelectric material 100 generates electrical energy upon or after experiencing the force depressing, stretching or otherwise structurally deforming the piezoelectric film. By way of example, but not limitation, piezoelectric materials of which the piezoelectric film 102 or piezoelectric material 100 can be comprised can include, but is not limited to, polyvinylidene fluoride (PVDF), which can generate electrical energy when the PVDF is structurally deformed (e.g., bent, stretch, compressed).

In some embodiments, the quantity of electrical energy generated can be proportional to the amount of deformation of the piezoelectric material 100 or the piezoelectric film 102. As such, with greater deformation, there can be a greater quantity of electrical energy generated. With lesser deformation, there can be a lesser quantity of electrical energy generated.

One or more embodiments of piezoelectric material 100 or piezoelectric film 102 can provide greater output voltage potential, and continuous (or continual) power generation during a time period during which the piezoelectric material 100 or piezoelectric film 102 is being deformed. As such, one or more embodiments can be employed to power a device or system for a defined amount of time as described below with reference to FIGS. 5A, 5B, 6A, 6B, 7, 8, 9, 10, 11, 12 and 13.

In various embodiments, the piezoelectric film 102 shown in FIG. 1 can be disposed on or intertwined with the elastic base 104. In various embodiments, the piezoelectric film 102 can be disposed on the elastic base 104, or any other type of suitable substrate, employing any number of different bonding techniques. In various different embodiments, bonding can be achieved through hot melt, flat press, and edge bonding techniques. In some embodiments, the bonding tape, bonding sheets and/or bonding chemicals can be Bemis Bonding Company bonding tape, bonding sheets and/or bonding chemicals. In some embodiments, the bonding machinery can include, but is not limited to, Macpi bonding machinery.

While the elastic base 104 and piezoelectric film 102 are formed as shown in FIG. 1, such formation is merely exemplary and, in other embodiments, the elastic base 104 and/or the piezoelectric film 102 can be formed in any number of other different shapes. By way of example, but not limitation, the elastic base 104 can be formed with a substantially flat surface as opposed to the semi-circular surface shown in the cross-sectional view of FIG. 1. Further, in some embodiments, although the piezoelectric is referred to as a piezoelectric film 102, in various embodiments, the piezoelectric can be a material or any number of different embodiments or formations of piezoelectrics, including, but not limited to, piezoceramics, piezoelectric powders, piezoelectric ribbons or the like.

Figure 2A:
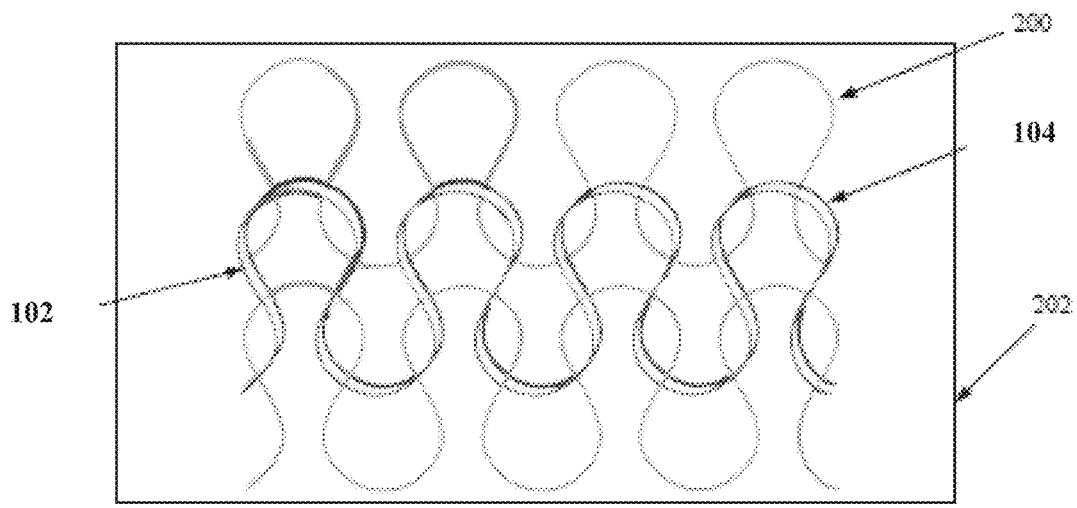
FIG. 2A illustrates a schematic diagram of an example of piezoelectric fabric in accordance with one or more embodiments described herein.

FIG. 2A illustrates a schematic diagram of an example of piezoelectric fabric 202 in accordance with one or more embodiments described herein. Repetitive description of like elements employed in other embodiments described herein is omitted for sake of brevity.

As shown, in some embodiments, the piezoelectric fabric 202 can be comprised of a knit structure of piezoelectric material 100 (e.g., piezoelectric film 102 coupled to elastic base 104) coupled to yarn 200. In some embodiments, the piezoelectric material 100 can be coupled to the yarn 200 in a coil configuration. The piezoelectric fabric 202 can facilitate energy harvesting of energy produced by a wearer or user of apparel incorporating the piezoelectric fabric 202.

In particular with reference to FIGS. 1 and 2A, in some embodiments, one or more methods of creation of piezoelectric fabric 202 (which can include the piezoelectric film 102 (or other piezoelectric material), the elastic base 104 and, in some embodiments, other yarns) can be employed for use in a broad spectrum of apparel applications. In some embodiments, piezoelectric yarn is the thread or fiber that is knit onto, into or around fabric. As used herein, the term "piezoelectric yarn" can be yarn included or employed to create piezoelectric fabric (e.g., piezoelectric fabric 202). In some embodiments, piezoelectric yarn be employed to create piezoelectric fabric. In some embodiments, piezoelectric fabric is the yardage that incorporates the piezoelectric yarn in addition to incorporation of another yarn. In some embodiments, piezoelectric fabric 200 can be a combination of piezoelectric material 100, piezoelectric yarn and another yarn (e.g., conventional yarn 200). In other embodiments, piezoelectric fabric 202 can be wholly formed from piezoelectric material 100 and another yarn (e.g., wholly formed from piezoelectric material 100 and conventional yarn 200).

Figure 2B:
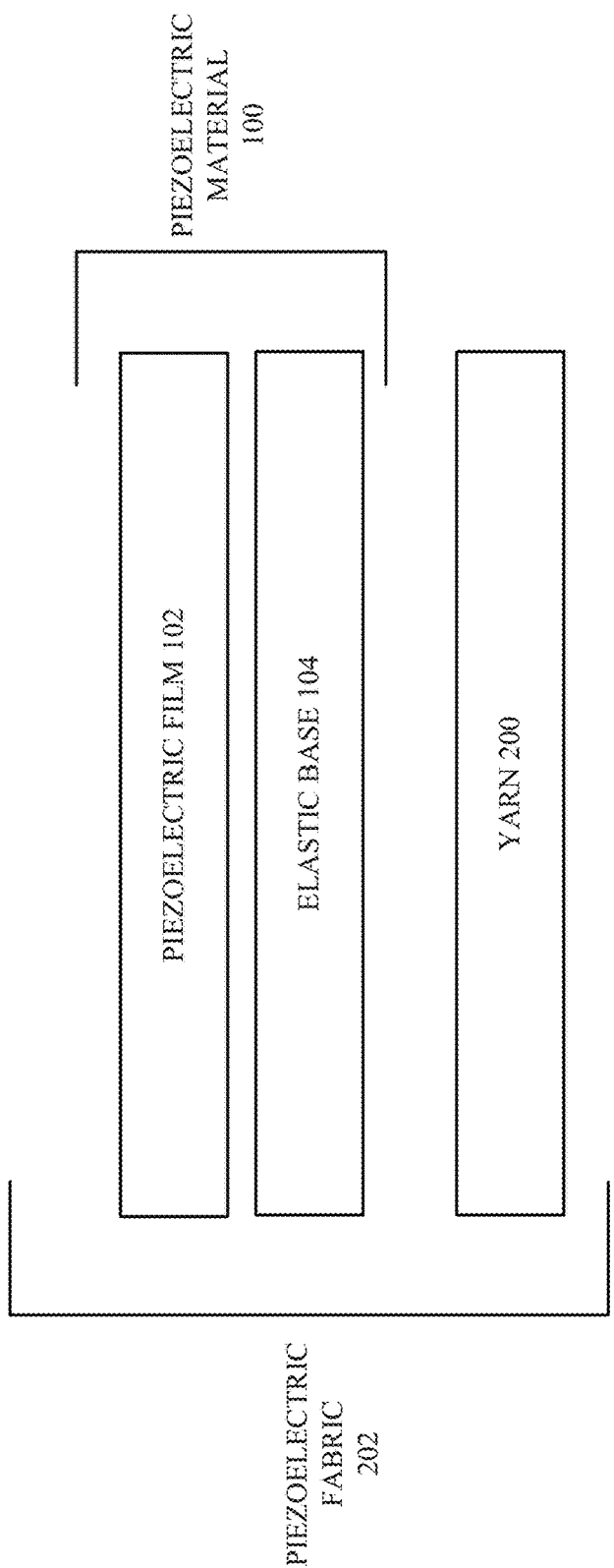
FIG. 2B illustrates a schematic diagram of an example of piezoelectric material and piezoelectric fabric in accordance with one or more embodiments described herein.

FIG. 2B illustrates a schematic diagram of an example of piezoelectric material and piezoelectric fabric in accordance with one or more embodiments described herein. Repetitive description of like elements employed in other embodiments described herein is omitted for sake of brevity. As shown in FIG. 2B, the piezoelectric material 100 can be composed of the piezoelectric film 102 and elastic base 104 while the piezoelectric fabric 202 can be composed of the piezoelectric material 100 and the yarn 200 in some embodiments.

A number of different types of piezoelectric fabric can be provided in different embodiments. FIG. 3 illustrates a schematic diagram of another example of a piezoelectric fabric (piezoelectric fabric 300) in accordance with one or more embodiments described herein. Repetitive description of like elements employed in other embodiments described herein is omitted for sake of brevity.

The piezoelectric fabric 300 can comprise a strengthening core 304 adjacent or coupled to an elastic core 306. Piezoelectric fabric 300 can comprise a piezoelectric film ribbon 302 (e.g., a PVDF film ribbon) coiled around the joint circumferences of or otherwise coupled to the strengthening core 304 and the elastic core 306. The strengthening core 304 can be comprised of a monofilament or other strengthening component in various embodiments. The elastic core 306 can be either tubular elastic or flat elastic in various embodiments. In some embodiments, the elastic core 306 can be composed of spandex or any type of suitable elastic material. As such, the piezoelectric fabric can be composed of embodiments other than piezoelectric material 100 knit into a coil configuration with yarn 200 shown in FIG. 2.

Figure 4:
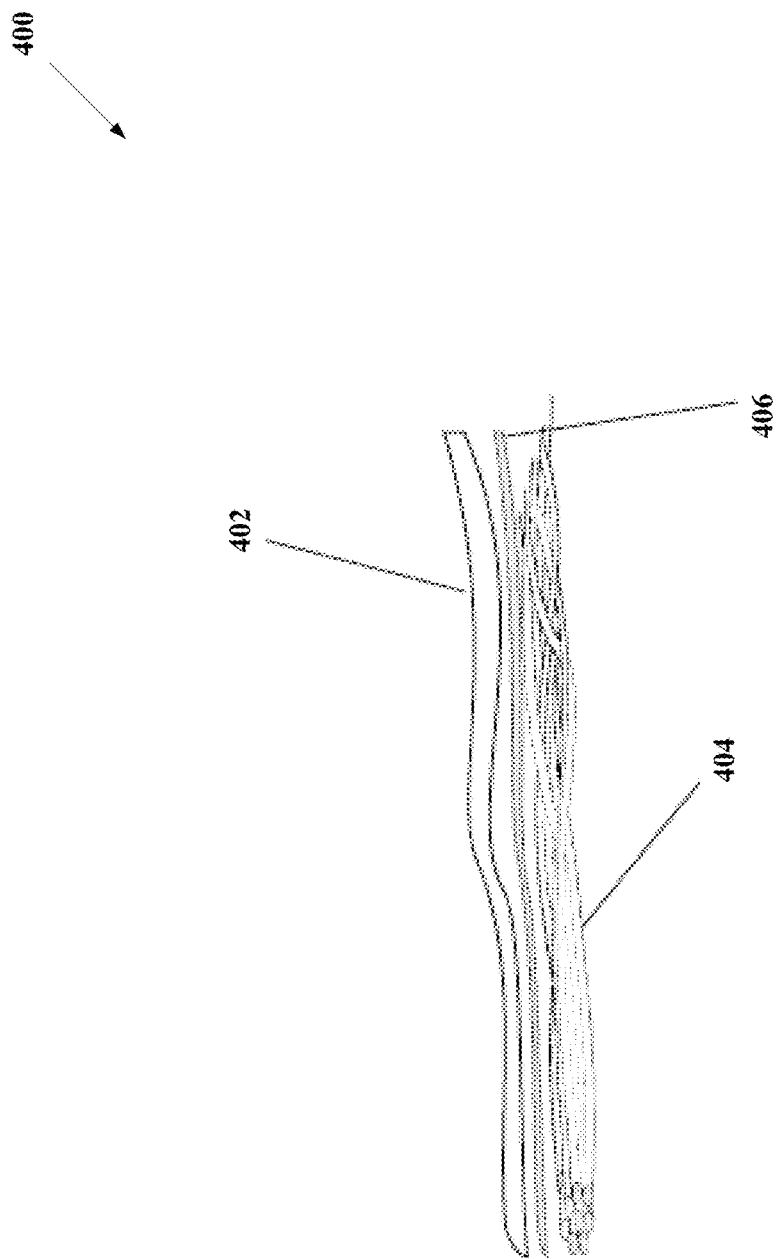
FIG. 4 illustrates a schematic diagram of another example of a piezoelectric fabric in accordance with one or more embodiments described herein.
Figure 5:
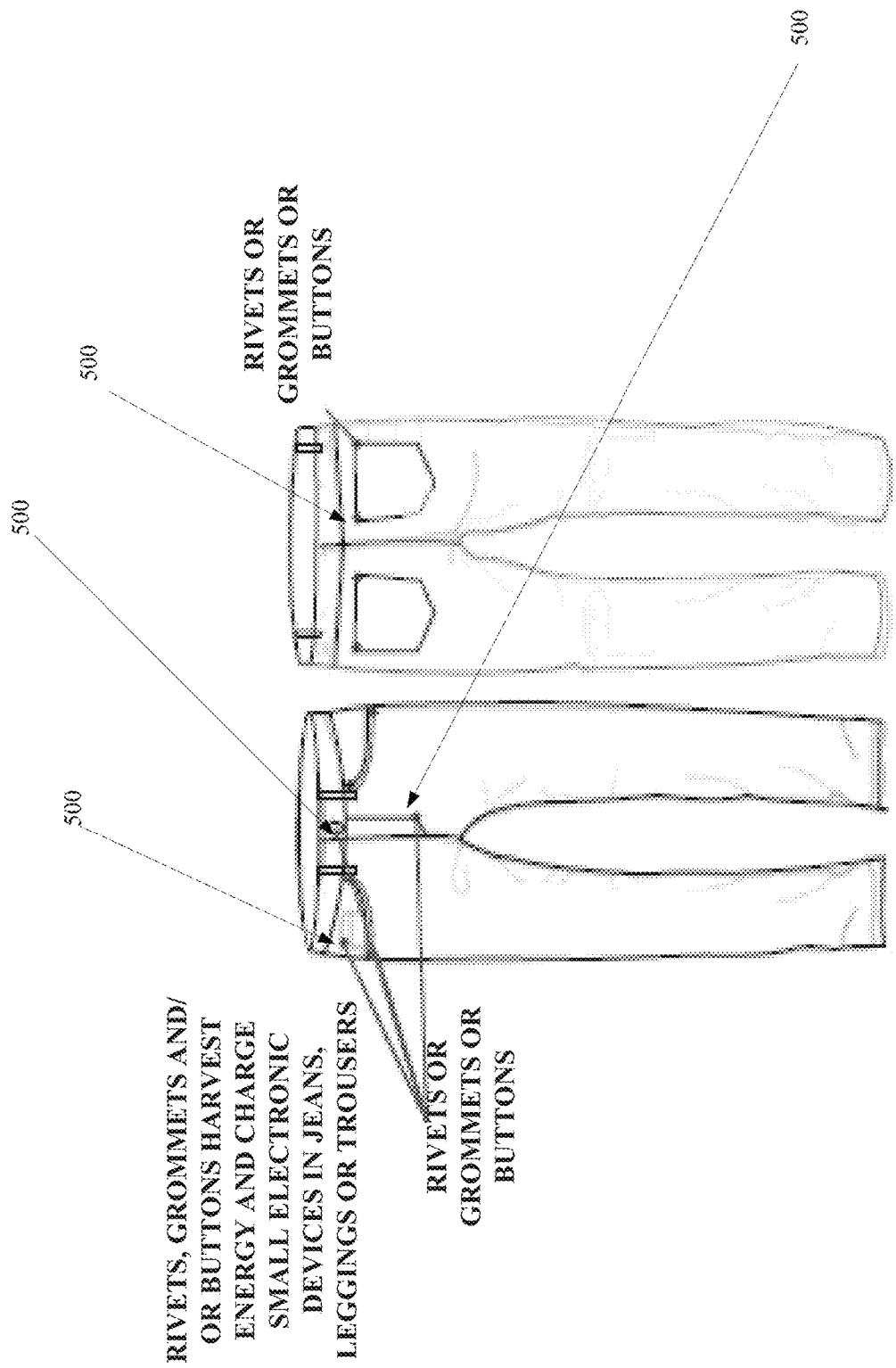
FIGS. 5A and 5B illustrate schematic diagrams of front and back views of an example of apparel including power connection components that facilitate transfer of energy harvested in accordance with one or more embodiments described herein.

FIG. 4 illustrates a schematic diagram of another example of a piezoelectric fabric (piezoelectric fabric 400) in accordance with one or more embodiments described herein. Repetitive description of like elements employed in other embodiments described herein is omitted for sake of brevity.

This embodiment of the piezoelectric fabric 400 can be comprised of a thin piezoelectric film ribbon 402 bonded to a polyester or combination nylon and spandex yarn 404 via an intervening bonding film 406. This embodiment is shown as FIG. 4.

The different embodiments of piezoelectric fabric (e.g., piezoelectric fabric 202, 300, 400) can provide energy production performance and physical stability. The most suitable embodiment of piezoelectric fabric can be employed for fabric production. In various embodiments, PVDF film ribbons, for example, can be manufactured and/or one or more different bonding techniques between the ribbon and the polyester or combination of nylon and spandex yarn can be employed, as shown in FIGS. 1, 2A, 2B, 3 and/or 4.

Figure 6:
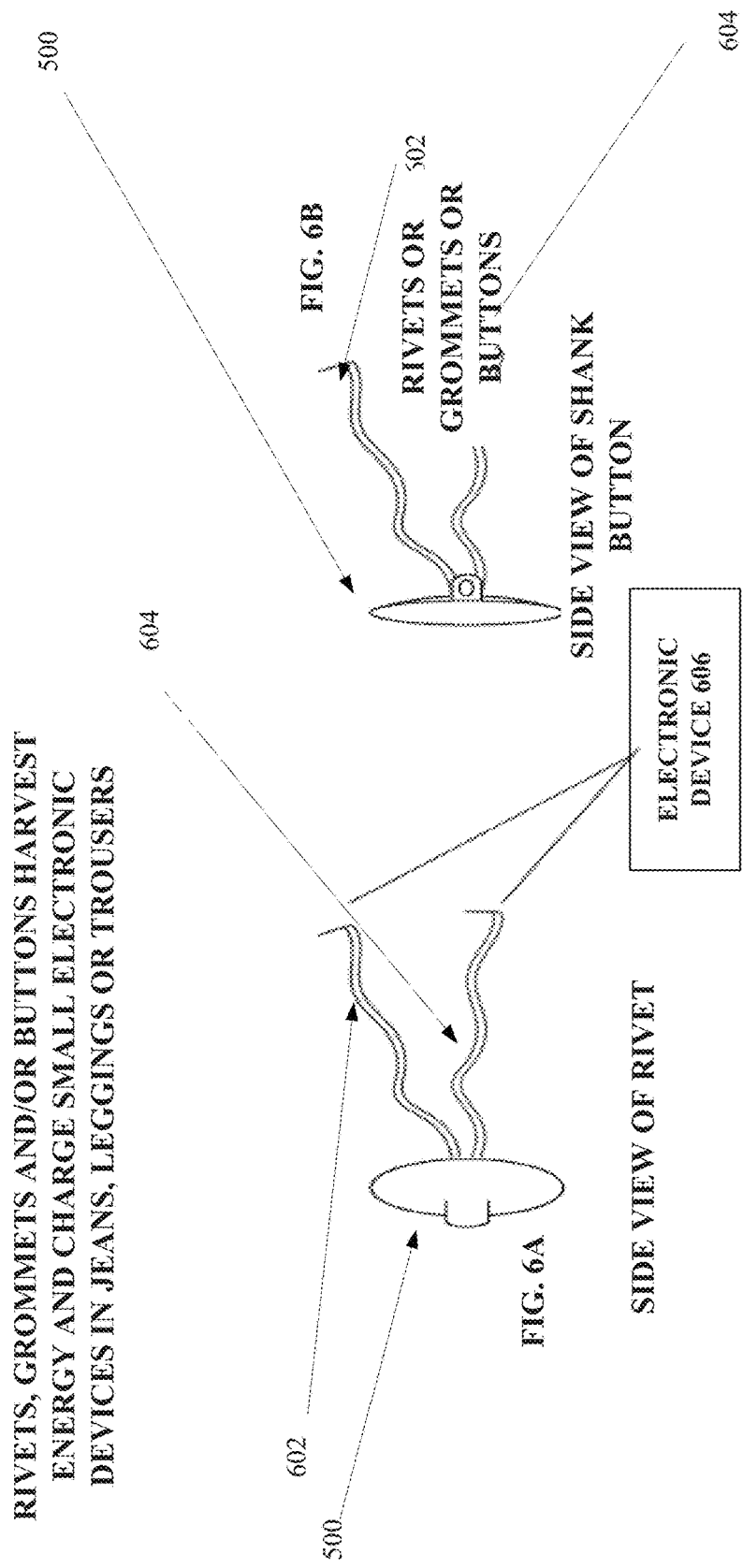
FIGS. 6A and 6B illustrate schematic diagrams of power connection components that can be included as a component of apparel and facilitate transfer of energy harvested in accordance with one or more embodiments described herein.
Figure 7:
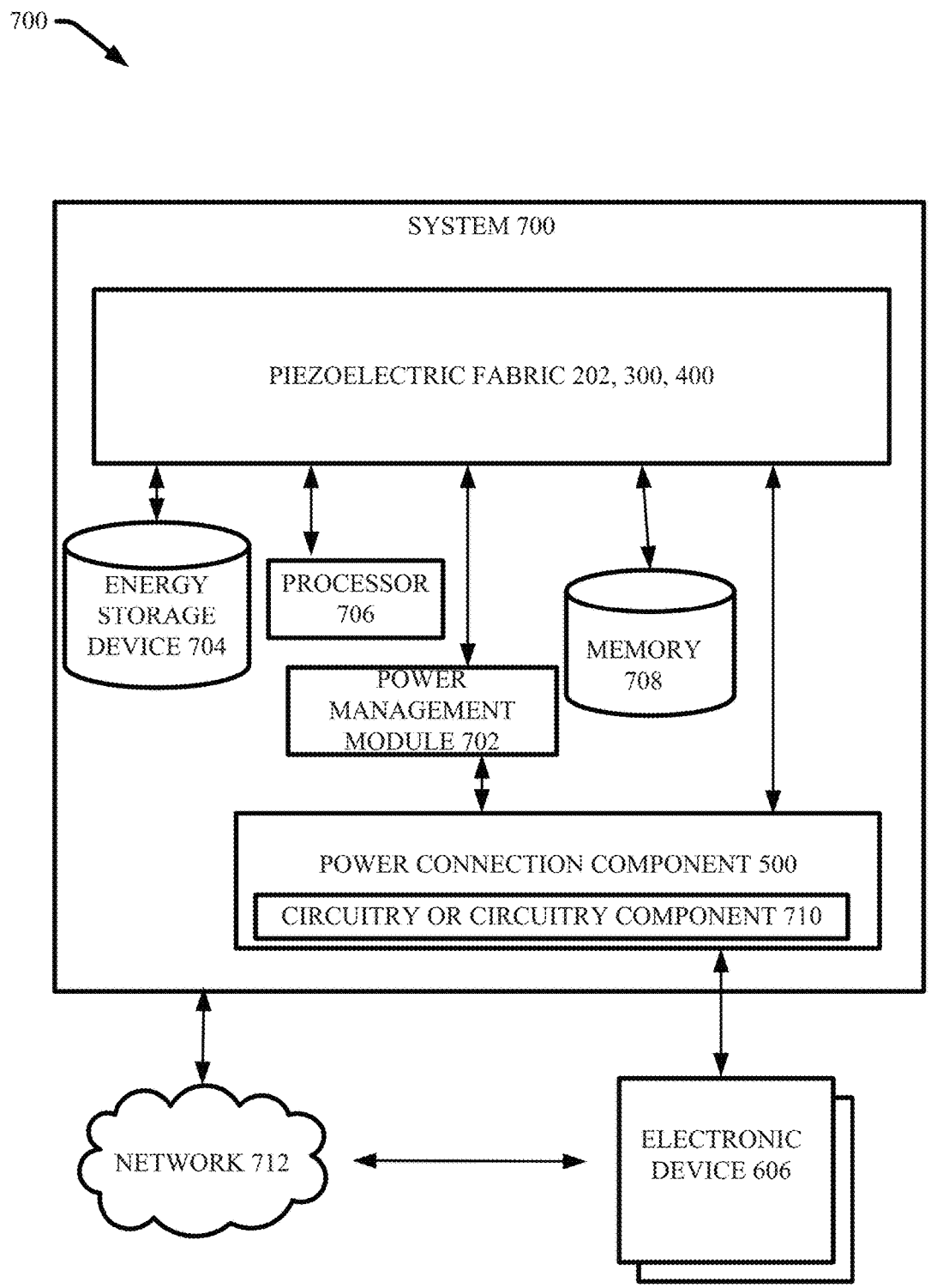
FIGS. 7, 8, 9 and 10 illustrate schematic diagrams of systems that can facilitate energy harvesting in accordance with one or more embodiments described herein.
Figure 8:
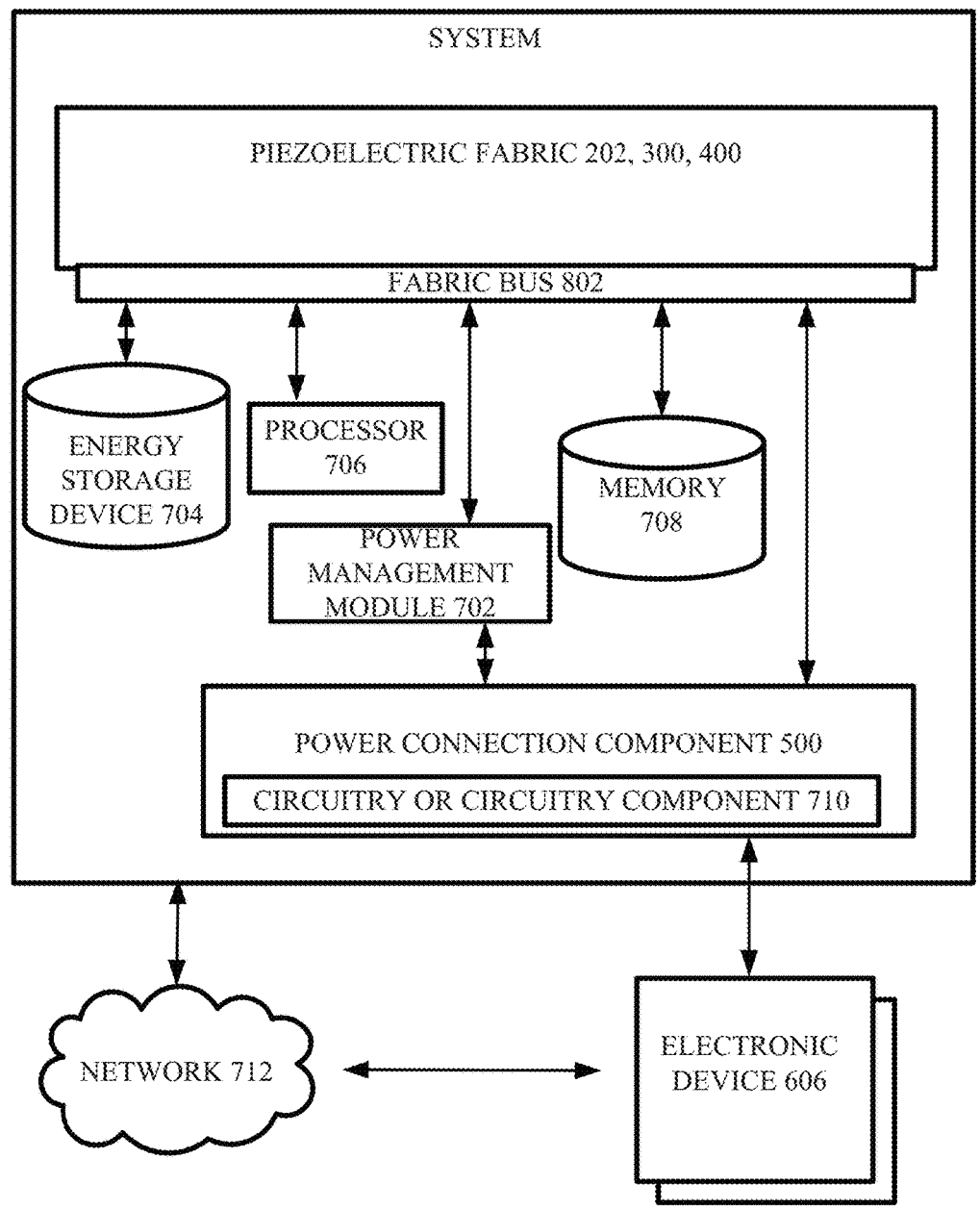
Figure 9:
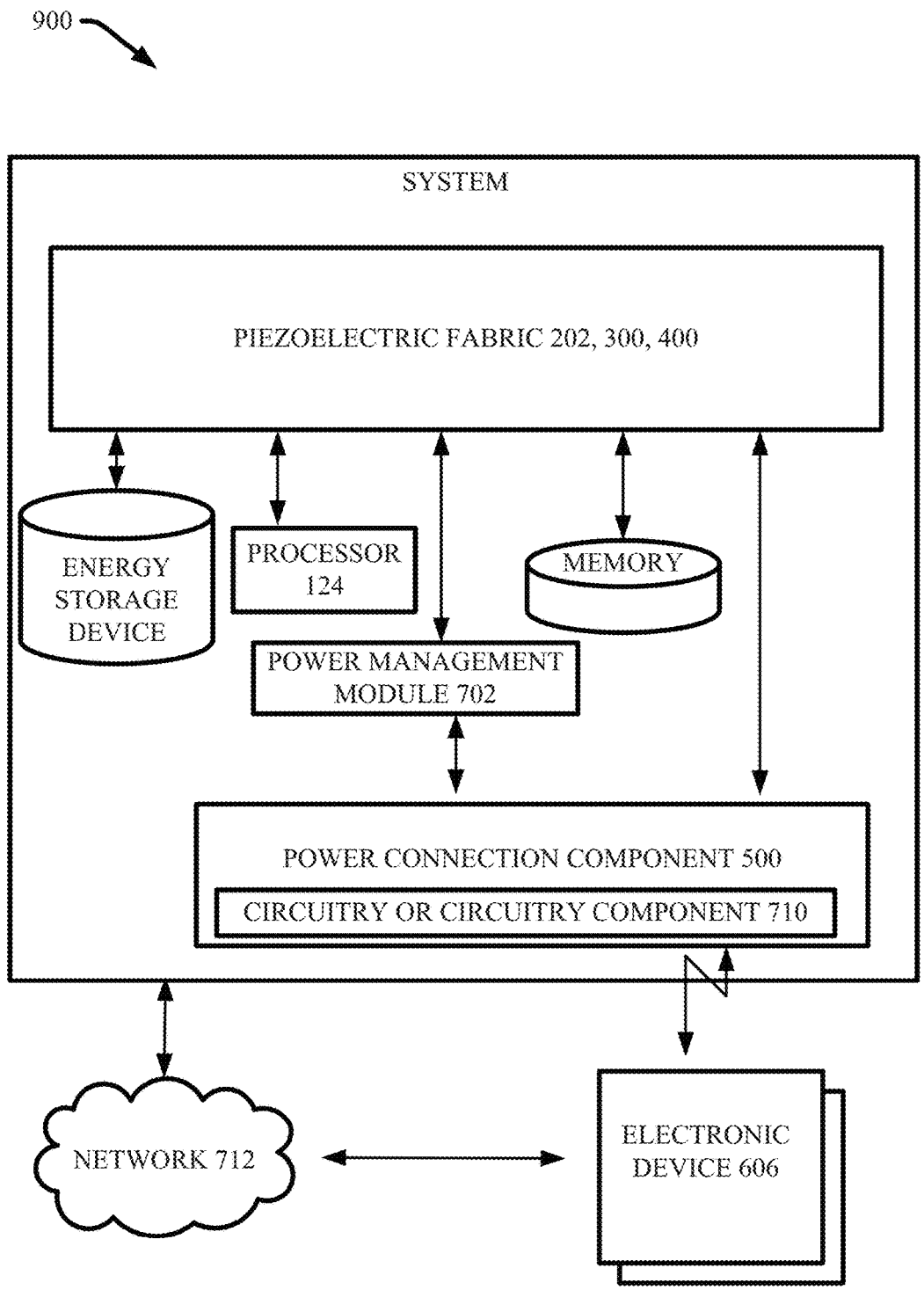

As described herein, the creation of a novel piezoelectric fabric 202, 300, 400 that incorporates piezoelectric material 100 and/or piezoelectric film 302 or piezoelectric film ribbon 402 can offer the greatest opportunity for manufacturing an energy harvesting fabric (e.g., piezoelectric fabric 202) that is versatile enough for use in a wide variety of products. For example, one or more embodiments described herein can include a novel piezoelectric material 100 that can be knitted in a unique configuration as shown in FIG. 2A that provides a defined structure for power generation through deformation and re-formation of the structure. For example, novel piezoelectric material 100 could be knit into the courses of any type of apparel, handbag or shoe that would naturally deform and reform with use (e.g., yoga pants or leggings, shoes, jackets, pockets) and the electrical energy created by movement of the user, and corresponding compression/decompression, can be harvested. In some embodiments, the electrical energy harvested can be stored in a power management module 702 (described below with reference to FIGS. 7, 8, 9 and 10) for charging an electronic device 606 (as shown in FIG. 6A).

As shown in FIG. 2A, in some embodiments, the piezoelectric fabric (e.g., piezoelectric fabric 202) can be formed in a coil configuration. By way of example, but not limitation, the knit structure can advantageously deform horizontally (by being stretched) as shown to generate piezoelectric energy. For example, when the piezoelectric fabric 202 is stretched, the stretching of the piezoelectric film 102 can cause electrical energy to be generated. In some embodiments, the stretch-compression combination can cause piezoelectric energy to be generated. In some embodiments, as shown, the knit structure in which the piezoeletric film 102, elastic base 104 and conventional yarn 200 is provided can be configured as coils that form the piezoelectric fabric 202. The piezoelectric film 102 can be bonded on a layer of the elastic base 104 and the bonded result can be configured as coils as shown in FIG. 2A.

Accordingly, an energy harvesting fabric (e.g., piezoelectric fabric 202, 300, 400) that produces and/or stores piezoelectric generated energy can be knit or otherwise formulated in accordance with one or more embodiments described herein. In different embodiments, the piezoelectric fabric 202, 300, 400 can be of knit or woven structures as well as nonwoven structures. Nonwoven structures can be fabrics that are created by fibers or yarns being melted, glued, bonded, or adhered together to form a sheet or fabric.

In one example, the energy harvesting fabric (e.g., piezoelectric fabric 202, 300, 400) can be formulated as a knit construction with courses of piezoelectric yarn interlooped with one or more courses of polyester or a combination of nylon and spandex yarn. In some embodiments, piezoelectric yarn can be employed to create piezoelectric fabric. In some embodiments, the polyester and/or combination of nylon and spandex yarn can be (or be included in) the elastic base 104 of FIGS. 1, 2A and 2B. In another embodiment, the polyester and/or nylon and spandex yarn can be a portion of the piezoelectric fabric 202, 300, 400. In yet another embodiment, the polyester and/or combination of nylon and spandex yarn can be the yarn 200 of FIG. 2A.

Equipment employed to perform interlooping can include, but is not limited to, textile knitting, weaving, or nonwoven machinery. Two yarns (e.g., conventional yarns such as yarn 200 or a conventional yarn 200 and another type of yarn such as a piezoelectric yarn) interlooped, as described herein, can include, but is not limited to, a combination of a staple fiber, for example cotton, interlooped with a synthetic polyester yarn. Another example of yarns interlooped includes, but is not limited to, interloping of spandex and polyester yarn to create a fabric.

The ratio of interlacement of the piezoelectric yarn and the polyester/spandex yarn can be any number of different ratios based, for example, on the performance of the desired piezoelectric yarn. As used herein, the terms "interlooping" and "interlacement" have similar meanings. Other standards yarns that can be employed include, but are not limited to, viscose spandex, rayon spandex, cotton spandex, synthetic fibers, and made-made cellulosic fibers. In some embodiments, the number of piezoelectric yarns can be much less than the number of polyester and/or combination of nylon and spandex yarns. For example, the number of rows of piezoelectric yarns incorporated per square inch or how many feeds of piezoelectric yarns are interloped into the fiber can be employed to determine whether the number of piezoelectric yarns are less than a particular number of polyester/spandex yarns.

One or more embodiments described herein can advantageously provide systems, articles of manufacture, apparatus and/or methods facilitating piezoelectric-based energy harvesting. For example, one or more embodiments can result in wearable technology yarn or fabric, articles of manufacture (e.g., apparel), systems (e.g., yarn, fabric, apparel including power management modules (e.g., power management module 702 described below with reference to FIGS. 6A, 6B, 7, 8, 9 and 10) and methods that facilitate generation, storage, use or manufacture of the energy. In some embodiments, the energy harvesting yarn, fabric, systems and/or methods can be employed to power or charge one or more electronic devices (e.g., electronic device 606 shown with reference to FIGS. 6A, 7, 8, 9 and 10). In various embodiments, the electronic devices can include, but are not limited to, cell phones, personal digital assistants, laptops, tablets, rechargeable batteries and/or other small electronic devices).

One or more embodiments include systems, articles of manufacture, apparatus and/or methods for yarn or piezoelectric fabric 202, 300, 400 (or the development of yarn and/or piezoelectric fabric 202, 300, 400) that can provide electrical energy for charging and/or providing power to an electrical device (e.g., cell phone). In some embodiments, yarn can be employed to create fabric. In some embodiments, the yarn and/or piezoelectric fabric 202, 300, 400 can be provided as a liner of an apparel item or a handbag for example. The liner of piezoelectric fabric 202, 300, 400 can be an inner liner between two layers of fabric in some embodiments. In some embodiments, the liner of piezoelectric fabric 202, 300, 400 can be an outer liner exposed to the air and/or directly resting on a portion of the body of the wearer. In some embodiments, the yarn or liner of the piezoelectric fabric 202, 300, 400 can be a liner of a handbag, pocket bag, or any item of apparel (e.g., yoga pants, shirts, shoes). For example, in one embodiment, the yarn or piezoelectric fabric 202, 300, 400 can be located, disposed and/or fabricated such that the yarn or piezoelectric fabric 202, 300, 400 can charge a device via placement of the device (e.g., cell phone, rechargeable battery or other small electronic device) on the surface of or otherwise in contact with a pair of pants, type of apparel. In some embodiments, the device can be connected to a rivet or grommet via one or more circuits.

In some embodiments, the yarn or piezoelectric fabric 202, 300, 400 can be located, disposed and/or fabricated such that the yarn or piezoelectric fabric 202, 300, 400 can charge a device via connection of the device with a rivet, grommet or button of the apparel, shoes or handbag connected to the piezoelectric fabric 202, 300, 400. The piezoelectric fabric 202, 300, 400 can be formed and/or used as a single layer fabric (e.g., single layer yoga pant), an outer fabric and/or an intermediate layer with the one or more of the same or different types of fabrics or the like. In some embodiments, a portion of the electronic device that can be charged by the piezoelectric fabric 202, 300, 400 can be specially designed to receive, capture, transmit and/or convey electrical energy.

FIGS. 5A and 5B illustrate schematic diagrams of front and back views of an example of apparel including power connection components (e.g., power connection components 500) that facilitate transfer of energy harvested in accordance with one or more embodiments described herein. FIGS. 6A and 6B illustrate schematic diagrams of power connection components that can be included as a component of apparel and facilitate transfer of energy harvested in accordance with one or more embodiments described herein. FIGS. 7, 8, 9 and 10 illustrate schematic diagrams of systems that can facilitate energy harvesting in accordance with one or more embodiments described herein. Repetitive description of like elements employed in other embodiments described herein is omitted for sake of brevity.

Referring first to FIGS. 5A and 5B, in various embodiments, the power connection components 500 can be or include rivets, grommets and/or buttons at different locations on apparel, handbags, shoes or the like. While the apparel shown are pants, trousers, jeans, any other apparel can be included as an embodiment and all such variations are envisaged.

In some embodiments described herein, fibers (e.g., yarn) of the energy harvesting fabric (e.g., piezoelectric fabric 202, 300, 400) can be electrically coupled to and/or connected to a power connection component 500 (e.g., to a rivet, a grommet, and/or a button). In some embodiments, the power connection component 500 and/or the piezoelectric fabric 202, 300, 400 can receive and/or capture the harvested energy.

In some embodiments, one or more of the power connection components 500 can include circuitry (e.g., circuitry or circuitry component 710 shown with reference to FIGS. 7, 8, 9 and 10) to store, capture, output and/or process the energy. By way of example, but not limitation, the rivet, grommet and/or button can perform one or more storage and/or processing functions of a battery, for example. In some embodiments, the rivet, grommet and/or button can include or cover a power management module (e.g., such as power management module 606 of FIGS. 6A and 6B) that can be coupled to or interwoven in the energy harvesting fabric (e.g., piezoelectric fabric 202, 300, 400).

With reference to FIGS. 6A and 6B, in some embodiments, the rivets, grommets and/or buttons can form a network of one or more components of circuitry (e.g., circuitry or circuitry component 710 shown with reference to FIGS. 7, 8, 9 and 10) to perform the storage, capture, output and/or processing. By way of example, but not limitation, in one embodiment, a rivet, grommet or button can include a circuit (e.g., circuitry or circuitry component 710 shown with reference to FIGS. 7, 8, 9 and 10) for storage and/or processing of harvested energy. As another example, a first rivet, grommet or button can include a circuit (e.g., circuitry or circuitry component 710 shown with reference to FIGS. 7, 8, 9 and 10) for storage and/or processing of harvested energy and another rivet, grommet or button can include another circuit or circuit component (e.g., circuitry or circuitry component 710 shown with reference to FIGS. 7, 8, 9 and 10) that is electrically coupled to the first rivet, grommet or button via one or more wires or other connections (e.g., which can be wireless connections or inductive connections).

In some embodiments, wireless circuits (e.g., circuitry or circuitry component 710 shown with reference to FIGS. 7, 8, 9 and 10) and/or systems can be employed for energy harvesting. For example, a small electronic device (e.g., electronic device 606 shown with reference to FIGS. 6A, 7, 8, 9 and 10) (e.g., cell phone) can be wirelessly charged via a power connection component 500 (e.g., rivet, grommet or button) in some embodiments. For example, the circuitry (e.g., circuitry or circuitry component 710 shown with reference to FIGS. 7, 8, 9 and 10) can include circuitry comprising a charger (e.g., wired or wireless charger) that can charge and/or power a small electronic device (electronic device 606) (e.g., battery or cell phone) via one or more telecommunication protocols (e.g., BLUETOOTH®, WI-FI®). As such, the small electronic device 606 can be charged without being physically connected to the circuit (e.g., circuitry or circuitry component 710 shown with reference to FIGS. 7, 8, 9 and 10) of the power connection component 500 via wire (e.g., wires 602, 604). For example, the circuitry (e.g., circuitry or circuitry component 710 shown with reference to FIGS. 7, 8, 9 and 10) can employ one or more different BLUETOOTH® or WI-FI® frequencies to transmit magnetic charge (e.g., magnetic charge 1002 of FIG. 10) to the small electronic device 606. In some embodiments, the circuitry (e.g., circuitry or circuitry component 710 shown with reference to FIGS. 7, 8, 9 and 10) of the power connection component 500 (e.g., circuitry or circuitry component 710 shown with reference to FIGS. 7, 8, 9 and 10) can facilitate use of one or more different radio frequency channels to perform charging or otherwise.

In some embodiments, the power connection component 500 can be a source of energy for the fibers and/or piezoelectric fabric 202, 300, 400. In some embodiments, fibers are strands that create fabric. Films can be non-woven materials that are adhered or glued or stretched to create a fabric or a topical treatment to a fabric. In some embodiments, the power connection component 500 can be a constant or periodic source of energy for the fibers and/or the piezoelectric fabric 202, 300, 400. In some embodiments in which the rivet, grommet and/or button is or comprises circuitry of a battery, the rivet, grommet and/or button can charge the energy harvesting fabric (e.g., piezoelectric fabric 202, 300, 400) and/or an electronic device 606. The rivet, grommet and/or button can be or include one or more batteries or circuitry (e.g., circuitry or circuitry component 710 shown with reference to FIGS. 7, 8, 9 and 10) that connects to the power management module 702 in some embodiments. While the rivets, grommets and/or buttons are shown in particular locations in FIG. 5, any number of different locations and/or different type of apparel, handbags and/or shoes can include one or more rivets, grommets and/or buttons for performing one or more functions described herein.

FIGS. 6A and 6B illustrates schematic diagrams showing power connection components 500 that can be included as a component of apparel and facilitate transfer of energy harvested in accordance with one or more embodiments described herein. The power connection components 500 can be or include rivets, grommets and/or buttons. As shown in FIGS. 6A and 6B, the incoming and/or outgoing wires 602, 604 or other circuitry (e.g., circuitry or circuitry component 710 shown with reference to FIGS. 7, 8, 9 and 10) can be used to connect the rivet to energy harvesting fabric, the power management module and/or other apparatus and/or circuitry or components of energy receiving and/or energy outputting (e.g., outputting to the piezoelectric fabric 202, 300, 400 and/or outputting to a small electronic device). The wires 602, 604 may or may not be needed in different embodiments. The rivet, grommet and/or button can be in a plurality of different shapes and/or configurations in various embodiments.

Shown in FIGS. 6A and 6B, shown are incoming wires 602, outgoing wires 604, that can connect the power connection component 500 to energy harvesting fabric or other mechanisms configured to transmit, receive and/or process or store energy. In some embodiments, wires 602, 604 are not necessary. As described, one or more embodiments, can be wireless. In various embodiments, incoming wires 602 and/or outgoing wires 604 can be employed to connect rivet and/or shank button to energy harvesting fabric and/or other components for energy output. In various embodiments, the power connection component 500 can be in a multitude of different shapes including, but not limited to, being formed in the input/output port of a cell phone or battery charger. This is just one example. The power connection component 500 can be formed in any number of different forms or configuration that can fit into a charging recess of a small electronic device.

Referring to FIGS. 6A, 6B, 7, 8, 9 and 10, in some embodiments, energy can flow through the power connection component 500. As such, the power connection component 500 can be formed in any number of shapes including, but not limited to, a shape complementary to the input/output port of one or more electronic devices. By way of example, but not limitation, the shape of the power connection component 500 (or at least a portion of the shape of the power connnection component 500) can be formed such that the power connection component 500 can be plugged into the power outlet of an electronic device 606, for example, be in the form of a power port of an electronic device 606.

In some embodiments, the piezoelectric fabric 202, 300, 400 can be composed of nano-sized particles or fibers to facilitate pliability and invisibility to the human eye. Similarly, the circuitry (e.g., circuitry or circuitry component 710 shown with reference to FIGS. 7, 8, 9 and 10) and/or one or more components of the circuitry or device can be a nanocircuitry and/or nanodevices.

Figure 10:
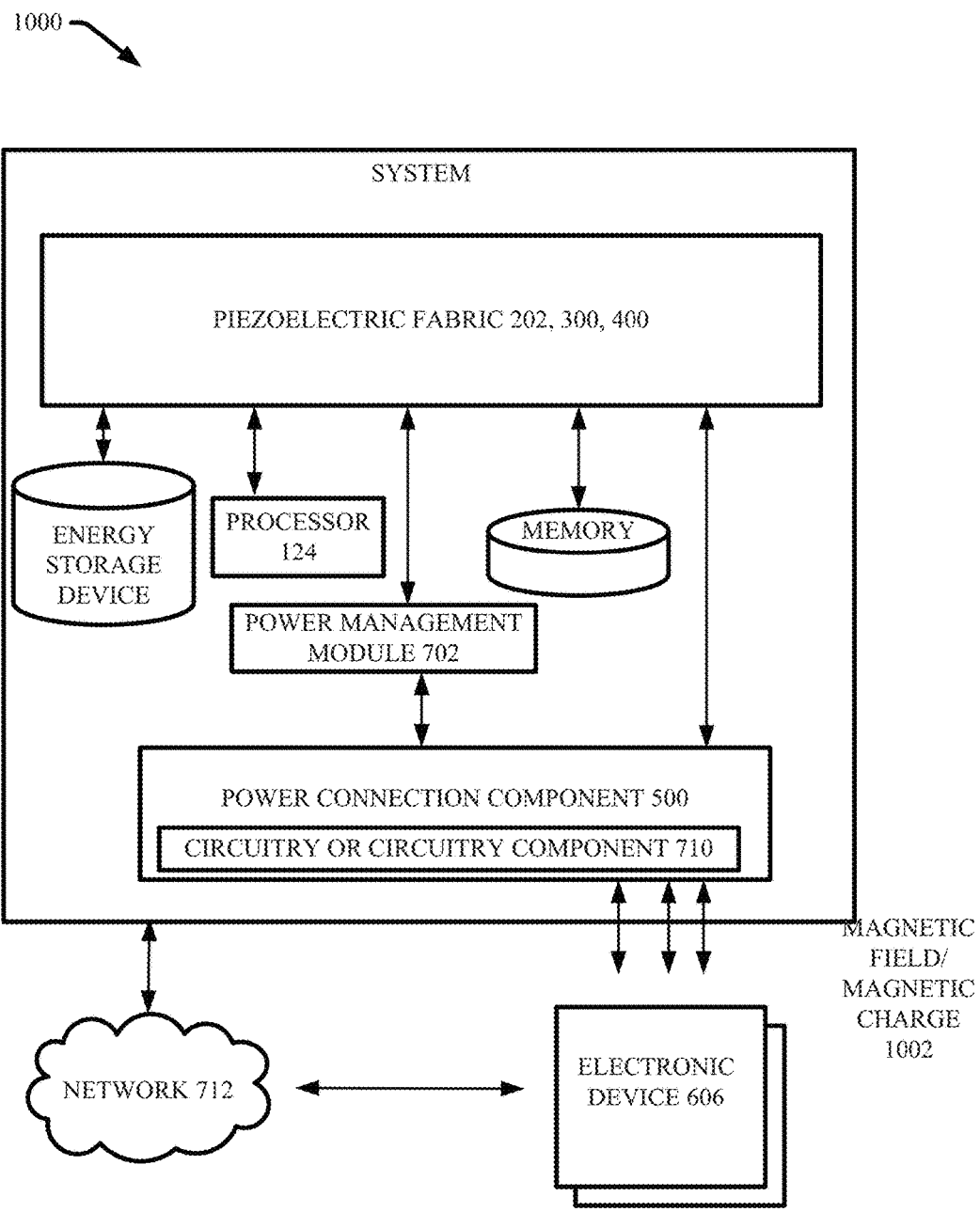

In some embodiments, one or more portions of the embodiments of the apparel having the piezoelectric fabric 202, 300, 400 can be plugged into and/or connected to a power source (not shown). By way of example, but not limitation, a rivet, grommet and/or button (such as that shown and/or described below with reference to FIG. 5A, 5B, 6A or 6B) can include at least one wire that can connect the rivet, grommet and/or button to a receiver component (not shown) that can plug into or connect to the power source. The receiver component can be configured to receive power from the power source. In various locations described herein, the rivet, grommet and/or button (or one or more components of the rivet, grommet and/or button) can be referred to alternatively as a "power connection component and/or power connection component 500." In various embodiments, a circuit (e.g., circuitry or circuitry component 710 shown with reference to FIGS. 7, 8, 9 and 10) of the power connection component 500 can power the electronic device 606 without being physically coupled to the electronic device 606. For example, in one embodiment, the electronic device 606 and the circuit 710 can include inductor coils (not shown) to enable inductive coupling between the circuit 710 and the electronic device 710 (as shown in FIG. 10). As such, in some embodiments, the circuit 710 can provide power to the device via the inductive coupling.

In some embodiments, the electronic device 606 need not be in physical contact with the surface of the yarn or fabric that facilitates energy as the piezoelectric material can be an inner liner of the apparel item. In other embodiments, the yarn or fabric can be provided as the sole fabric and/or on the outer surface of a lined apparel item.

One or more embodiments can include an energy harvesting yarn (e.g., piezoelectric yarn), an energy harvesting fabric (e.g., piezoelectric fabric 202, 300, 400) and/or a power management module 702 that can be employed with the energy harvesting yarn or fabric (e.g., piezoelectric fabric 202, 300, 400).

For the development of the energy harvesting yarn and fabric (e.g., piezoelectric fabric 202, 300, 400), one or more embodiments can facilitate, achieve and/or involve evaluation and optimization of a novel piezoelectric knitting yarn, evaluation and optimization of an energy harvesting knit fabric composed of novel piezoelectric knitting yarns, evaluation and optimization of the power management module for the energy harvesting fabric and/or an energy harvesting fabric system operation (yarn, fabric, and/or power management working as a system). In some embodiments, piezoelectric knitting yarns can be yarns that can be employed to create fabric (e.g., piezoelectric fabric).

There are several technical embodiments described herein for energy harvesting using apparel as a platform. One or more embodiments can employ different embodiments based on the apparel application and/or end use. For example, a cell phone can be placed on or in close proximity to jeans, yoga pants, or trousers and one or more embodiments described herein can charge the cell phone. In some embodiments, a cell phone can be placed in an inside pocket (lined with the piezoelectric fabric) and can charge the cell phone. In some embodiments, bottoms, tops, or jackets can be lined in piezoelectric fabric and can charge a cell phone. Also, the technology can be robust and reliable. By way of example, but not limitation, energy harvesting yarn or fabric (e.g., piezoelectric fabric 202, 300, 400) can be employed in various different environments able to be withstood by a human body, while maintaining the appearance of ordinary clothing. In some cases, one or more embodiments can be employed onboard space travel vehicles (e.g., space shuttles), on the international space station and/or in space. For example, there can be one or more embodiments, that enable charging small electronics for astronauts. Nanocircuits and/or nanodevices can be employed in one or more of these different embodiments.

In some embodiments, one or more courses of piezoelectric yarn can terminate into a band of conductive fibers (e.g., shown as fabric bus 802 in FIG. 8) located at the edge of the piezoelectric fabric 202, 300, 400 or, in some embodiments, at any defined location within the piezoelectric fabric 202, 300, 400. The band of conductive fibers (e.g., fabric bus 802) can be configured to perform one or more functions of an electrical bus that can connect to one or more components, including, but not limited to, power management module 702, memory 708, processor 706, energy storage device 704 and/or power connection component 500. As such, via the connection between the band of conductive fibers (e.g., fabric bus 802) and the power management module 702, the conductive fibers (e.g., fabric bus 802) can transmit electrical energy to the power management module 702 (e.g., for storage and/or processing by the power management module 702).

In some embodiments, the power management module 702 can be or include a self contained power management unit (not shown) with a small footprint. Example ranges in size and/or any measurements detailing desired flexibility of the power management module 702 for comfort of the wearer of the apparel can call for the power management module 702 to be no larger than the dimensions of a typical AA battery (e.g., no longer than approximately 49.2 to 50.5 millimeters (mm) in length, and no greater than a diameter of about 13.5 to 14.5 mm) and no smaller than a 1 centimeter (cm) rivet. In other embodiments, other sizes can be employed depending on the type of apparel (e.g., pants versus jacket) and/or any number of other factors.

In one embodiment, the power management module 702 can have two or more operational sections electrically coupled to one another. For example, the power management module can include three operational sections electrically coupled to one including, but not limited to, an alternating current (AC) to direct current (DC) conversion circuitry, a DC to DC conditioning circuitry, and/or battery interface circuitry.

In some embodiments, the AC to DC conversion circuitry can change the alternating current received from the piezoelectric fabric 202, 300, 400 into a direct current that can be employed to charge an electronic device 606 (e.g., storage battery). The output of the conversion circuitry section can be capacitance coupled to the DC to DC conditioning circuitry. The conditioning circuitry can produce a defined voltage level and a defined current level that can facilitate battery charging (for example, to charge the battery of a cell phone, camera or other electronic device in connection with the battery interface circuitry).

In some embodiments, the battery interface circuitry can provide the physical connection hardware to attach a device for re-charging the device. In some embodiments, the physical footprint of the power management module 702 can be determined, components can be selected appropriate to function and footprint, construction and testing of power management module 702 performance can be performed and an interface with the piezoelectric fabric 202, 300, 400 fabric bus 802 can be facilitated.

In some embodiments, the electronics can include AC to DC conversion circuitry and/or devices, DC to DC conditioning circuitry and/or devices, flexible lithium battery, battery interface hardware, external power supply (associated with the device) and/or a breadboard circuit.

In some embodiments, the equipment and/or instruments to fabricate and/or test the knit piezoelectric fabric 202, 300, 400 can include, but is not limited to, a knitting machine, an oscilloscope, an extruder die head (single and multiple strands and film extrusion), machine that tests tensile, compression, fatigue, rheology, structure and/or impact of materials (e.g., Instron equipment or instruments), scanning electron microscope (SEM), dynamic mechanical analysis (DMA) machine, microscope and/or video camera.

In one or more embodiments, one or more different knit structures for facilitating and/or maximizing or optimizing energy production can be provided. In some embodiments, a defined ratio of piezoelectric (e.g., piezoelectric film 102, piezoelectric film ribbon 302, piezoelectric elements and/or piezo ceramics) to standard yarns (e.g., yarn 200) can be provided. In various embodiments, the piezoelectric fabric can be tested to determine content ratio. In the textile field ratios are indicated for example 70% nylon 30% spandex or 10% cotton, 70% nylon, 20% spandex. The piezoelectric fabric 202, 300, 400 content can be tested and have a specific content ration with an industry standard tolerance of +/−3%. Examples could be (depending on the specific ratio determined to be desirable for conforming and/or energy harvesting perspectives) 5% to 50% piezoelectric fiber with the remainder being other yarn (e.g., yarn 200) or yarn combination. In some embodiments, termination of yarns at the fabric edge can be provided such as that shown at fabric bus 802 with reference to FIG. 8.

In some embodiments, at least two embodiments of piezoelectric fabric 202, 300, 400, a knitting technique that results in the fabrication of a piezoelectric fabric 202, 300, 400, and/or a compact power management module (e.g., power management module 702) to condition and/or store energy can be provided. The expected performance and/or one or more physical characteristics, which can be based on the correct application of the piezoelectric fabric 202, 300, 400 can be provided. One or more embodiments can vary by proof of concept fabric samples, materials and methods specifications, performance data, application recommendations, and recommendations.

In various embodiments, piezoelectric material 100 or piezoelectric film 102 or piezoelectric film ribbon 302 can include, but is not limited to, PVDF, PVDF film and/or ribbon film. Yarns (e.g., yarn 200) can include, but are not limited to, a combination of polyester and spandex (e.g., 95% polyester/5% spandex), spandex yarn and/or conductive yarn. In various embodiments, conductive yarns (e.g., yarn 200) can include, but are not limited to, silver yarns, carbon nanotube yarns, metal yarns and/or metal plated yarns.

Figure 11:
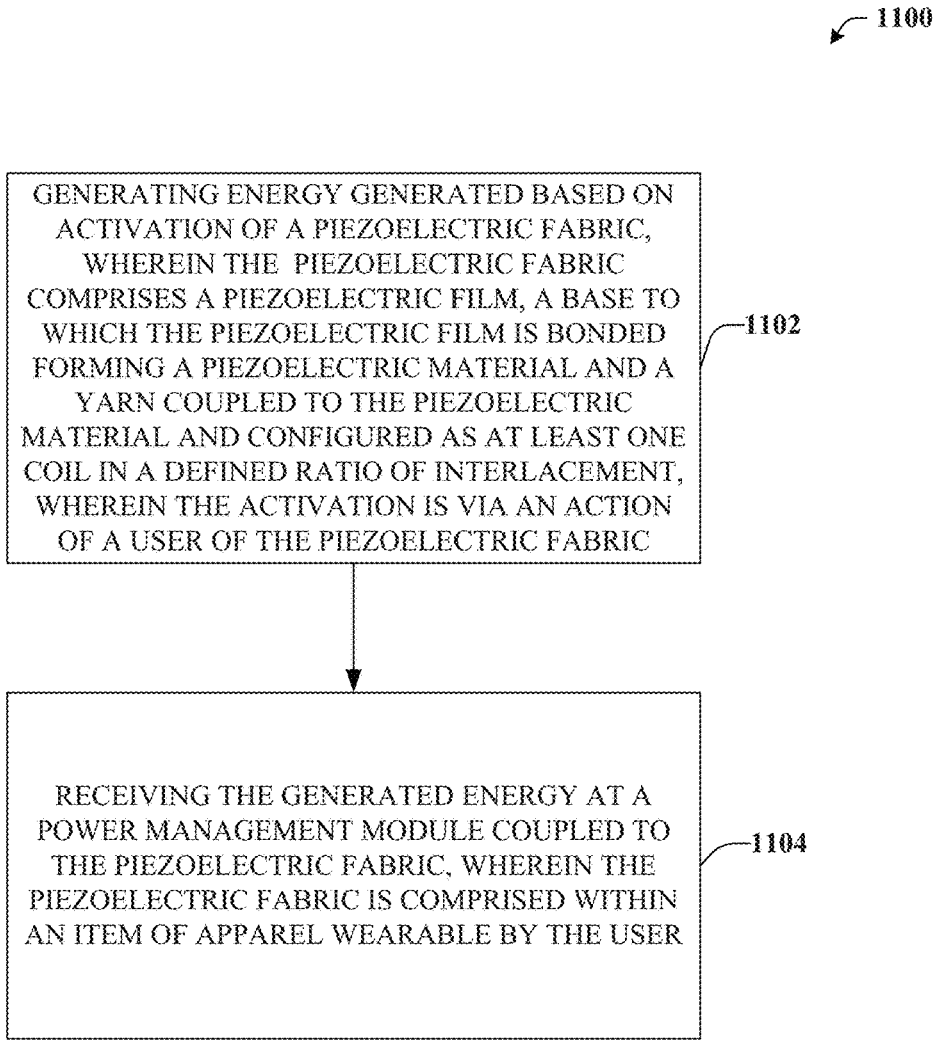
FIGS. 11, 12 and 13 illustrate flow diagrams of methods of facilitate energy harvesting in accordance with one or more embodiments described herein.
Figure 12:
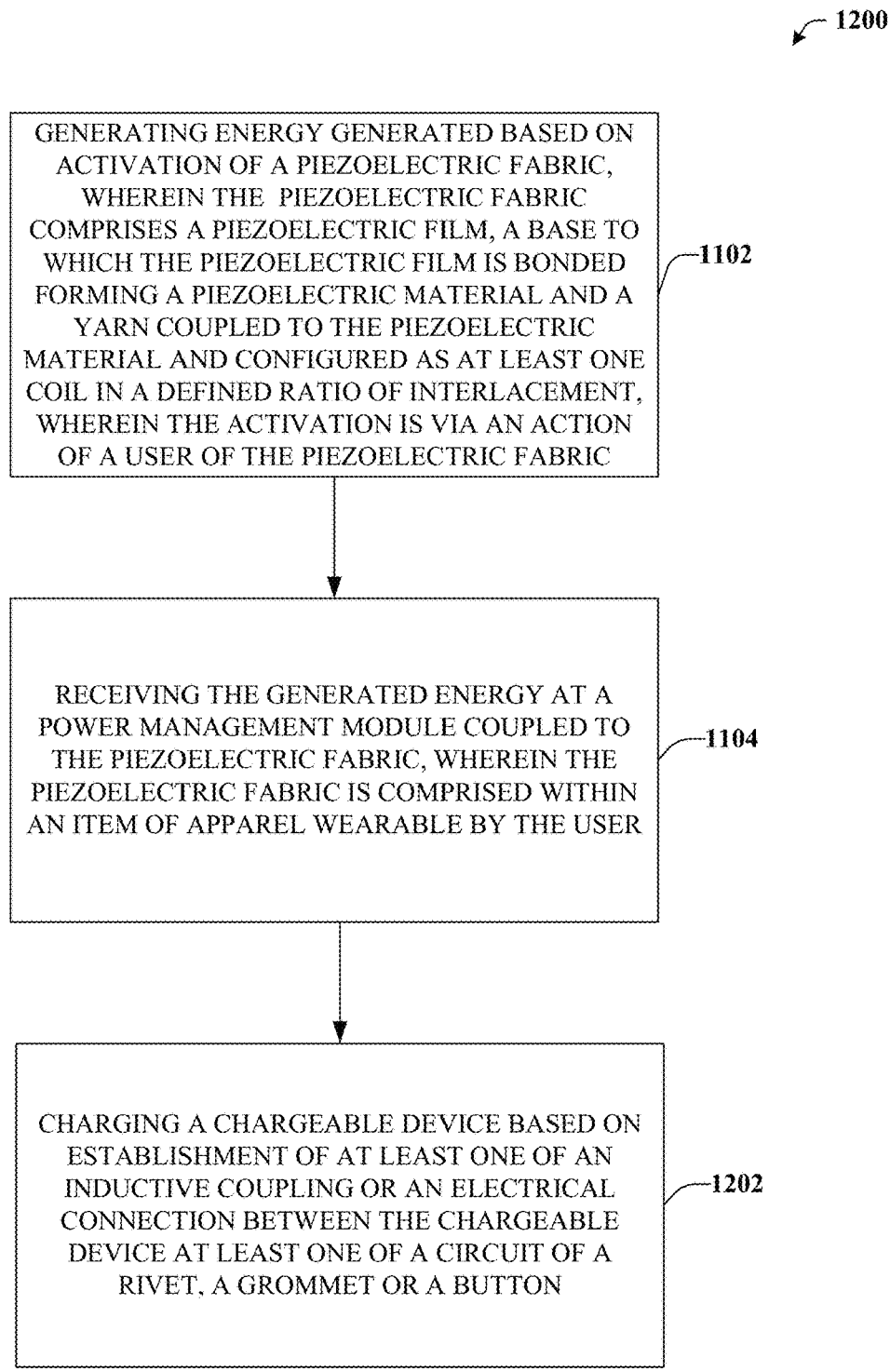
Figure 13:
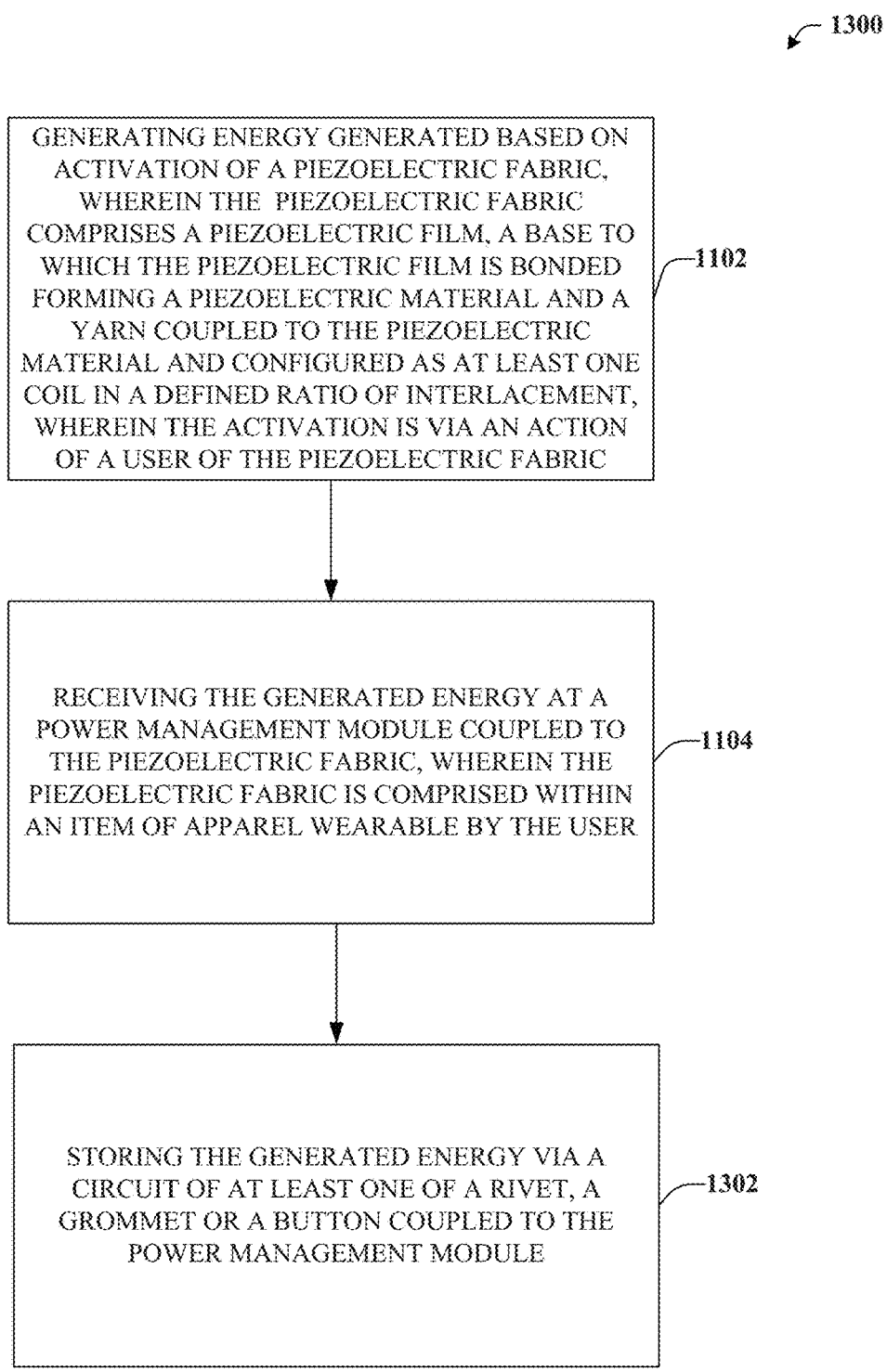

FIGS. 11, 12 and 13 illustrate flow diagrams of methods of facilitate energy harvesting in accordance with one or more embodiments described herein. Turning first to FIG. 11, at 1102, method 1100 can include generating energy generated based on activation of a piezoelectric fabric, wherein the piezoelectric fabric comprises a piezoelectric film, a base to which the piezoelectric film is bonded forming a piezoelectric material and a yarn coupled to the piezoelectric material and configured as at least one coil in a defined ratio of interlacement, wherein the activation is via an action of a user of the piezoelectric fabric. At 1104, method 110 can include receiving the generated energy at a power management module coupled to the piezoelectric fabric, wherein the piezoelectric fabric is comprised within an item of apparel wearable by the user.

Turning now to FIGS. 12, 1102 and 1104 can be as shown in method 1100 in some embodiments. At 1202, method 1200 can comprise charging a chargeable device based on establishment of at least one of an inductive coupling or an electrical connection between the chargeable device at least one of a circuit of a rivet, a grommet or a button.

Turning now to FIGS. 13, 1102 and 1104 can be as shown in method 1100 in some embodiments. At 1302, method 1300 can comprise storing the generated energy via a circuit of at least one of a rivet, a grommet or a button coupled to the power management module.

Figure 14:
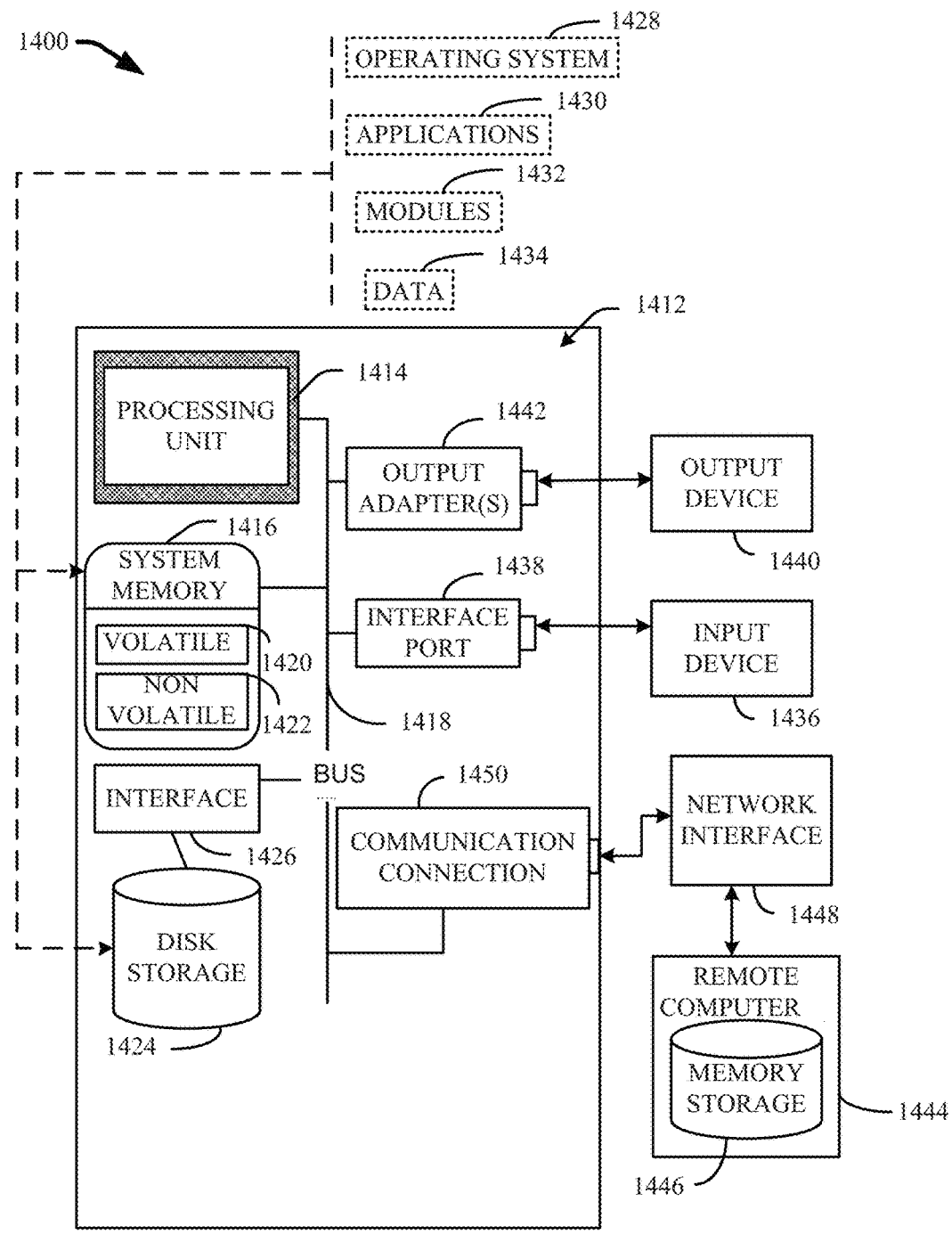
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is omitted for sake of brevity. With reference to FIG. 14, a suitable operating environment 1400 for implementing various aspects of this disclosure can include a computer 1412. The computer 1412 can also include a processing unit 1414, a system memory 1416, and a system bus 1418. The system bus 1418 can operably couple system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1416 can also include volatile memory 1420 and nonvolatile memory 1422. The basic input/output system (BIOS), containing the basic routines to transfer information between elements within the computer 1412, such as during start-up, can be stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface can be used, such as interface 1426. FIG. 14 also depicts software that can act as an intermediary between users and the basic computer resources described in the suitable operating environment 1400. Such software can also include, for example, an operating system 1428. Operating system 1428, which can be stored on disk storage 1424, acts to control and allocate resources of the computer 1412. System applications 1430 can take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through one or more input devices 1436. Input devices 1436 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1414 through the system bus 1418 via one or more interface ports 1438. The one or more Interface ports 1438 can include, for example, a serial port, a parallel port, a game port, and a universal serial bus (USB). One or more output devices 1440 can use some of the same type of ports as input device 1436. Thus, for example, a USB port can be used to provide input to computer 1412, and to output information from computer 1412 to an output device 1440. Output adapter 1442 can be provided to illustrate that there are some output devices 1440 like monitors, speakers, and printers, among other output devices 1440, which require special adapters. The output adapters 1442 can include, by way of illustration and not limitation, video and sound cards that provide a means of connection between the output device 1440 and the system bus 1418. It should be noted that other devices and/or systems of devices provide both input and output capabilities such as one or more remote computers 1444.

Computer 1412 can operate in a networked environment using logical connections to one or more remote computers, such as remote computer 1444. The remote computer 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer 1444. Remote computer 1444 can be logically connected to computer 1412 through a network interface 1448 and then physically connected via communication connection 1450. Further, operation can be distributed across multiple (local and remote) systems. Network interface 1448 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An article of manufacture, comprising:
  a piezoelectric fabric comprising:
    a piezoelectric film;
    an elastic base on which the piezoelectric film is bonded forming a piezoelectric material; and
    a yarn, wherein the yarn and the piezoelectric material are coupled to one another in a defined ratio of interlacement.

2. The article of manufacture of claim 1, wherein the yarn and the piezoelectric material are configured as coils in the defined ratio of interlacement.

3. The article of manufacture of claim 1, wherein the piezoelectric material is configured such that compression or elongation of the piezoelectric fabric generates electrical energy.

4. The article of manufacture of claim 1, wherein the article of manufacture further comprises a power connection component electrically coupled to the piezoelectric fabric and configured to receive or capture harvested energy.

5. The article of manufacture of claim 4, wherein the power connection component comprises a rivet.

6. The article of manufacture of claim 4, wherein the power connection component comprises a grommet.

7. The article of manufacture of claim 4, wherein the power connection component comprises a button.

8. The article of manufacture of claim 4, wherein the power connection component is at least one of a rivet, a grommet or a button and the power connection component is adapted to be received by a power port of an electronic device to charge the electronic device.

9. The article of manufacture of claim 1, wherein the yarn is at least one of a conductive yarn or a combination of polyester and spandex.

10. The article of manufacture of claim 9, wherein the conductive yarn comprises at least one of metal yarn, carbon nanotube yarn or metal plated yarn.

11. The article of manufacture of claim 4, wherein the power connection component comprises a circuit configured to perform storage or processing of harvested energy and wherein the power connection component is included in a network of a plurality of rivets, grommets or buttons of the article of manufacture.

12. The article of manufacture of claim 4, wherein the power connection component is at least one of a rivet, a grommet or a button and the power connection component is further adapted to wirelessly charge a mobile device.

13. The article of manufacture of claim 1, wherein the article of manufacture is comprised in at least one of a shoe or a handbag.

14. A system, comprising:
a piezoelectric fabric comprising:
   a piezoelectric film;
   a base to which the piezoelectric film is bonded forming a piezoelectric material; and
   a yarn coupled to the piezoelectric material in a defined ratio of interlacement; and
a power management module configured to store energy generated from the piezoelectric fabric and electrically coupled to a band of conductive fibers comprised of the piezoelectric fabric, wherein the conductive fibers perform one or more functions of an electrical bus.

15. The system of claim 14, further comprising:
at least one of a rivet, a grommet or a button electrically coupled to the piezoeletric fabric and to the power management module.

16. The system of claim 15, wherein the at least one of the rivet, grommet or button is electrically coupled to the power management module by a wireless communication channel, and wherein the at least one of the rivet, grommet or button comprises inductor coils to enable inductive coupling between an inductive circuit of the at least one of the rivet, grommet or button and a chargeable device.

17. The system of claim 15, wherein the at least one of the rivet, grommet or button is adapted to be received by a power port of an electronic device to charge the electronic device, and wherein the electronic device comprises a rechargeable battery or a mobile device.

18. A method, comprising:
generating energy generated based on activation of a piezoelectric fabric, wherein the piezoelectric fabric comprises a piezoelectric film, a base to which the piezoelectric film is bonded forming a piezoelectric material and a yarn coupled to the piezoelectric material and configured as at least one coil in a defined ratio of interlacement, wherein the activation is via an action of a user of the piezoelectric fabric; and
receiving the generated energy at a power management module coupled to the piezoelectric fabric, wherein the piezoelectric fabric is comprised within an item of apparel wearable by the user.

19. The method of claim 18, wherein the method further comprises:
charging a chargeable device based on establishment of at least one of an inductive coupling or an electrical connection between the chargeable device at least one of a circuit of a rivet, a grommet or a button.

20. The method of claim 18, wherein the method further comprises:
storing the generated energy via a circuit of at least one of a rivet, a grommet or a button coupled to the power management module.

* * * * *